(12) United States Patent
Liu

(10) Patent No.: US 7,020,570 B2
(45) Date of Patent: Mar. 28, 2006

(54) ACCELERATED TEST METHOD AND SYSTEM

(76) Inventor: Yen-Fu Liu, No. 15-2, Lane 125, Yuan-Hua Rd., Chungli City, Taoyuan Hsien (TW)

( * ) Notice: Subject to any disclaimer, the term of this patent is extended or adjusted under 35 U.S.C. 154(b) by 43 days.

(21) Appl. No.: 10/713,154

(22) Filed: Nov. 17, 2003

(65) Prior Publication Data

US 2004/0260502 A1   Dec. 23, 2004

(30) Foreign Application Priority Data

Jun. 19, 2003   (TW) ............................... 92116634 A

(51) Int. Cl.
*G06F 19/00* (2006.01)

(52) U.S. Cl. ...................... 702/117; 702/108

(58) Field of Classification Search ................ 324/500, 324/537, 763, 764, 765, 766, 767, 768; 702/108, 702/109, 117, 118, 120; 713/176, 179, 180, 713/181, 193, 194; 714/724, 733, 734, 735, 714/736, 737

See application file for complete search history.

(56) References Cited

U.S. PATENT DOCUMENTS

| | | | |
|---|---|---|---|
| 6,374,354 B1* | 4/2002 | Walmsley et al. | 713/167 |
| 6,507,800 B1* | 1/2003 | Sheu | 702/117 |
| 6,704,871 B1* | 3/2004 | Kaplan et al. | 713/192 |
| 6,708,273 B1* | 3/2004 | Ober et al. | 713/189 |
| 6,757,832 B1* | 6/2004 | Silverbrook et al. | 713/194 |
| 6,816,968 B1* | 11/2004 | Walmsley | 713/168 |
| 2004/0133831 A1* | 7/2004 | Williams et al. | 714/726 |

OTHER PUBLICATIONS

Ferrari, F;"System-on-a-Chip Verification-Methodology and Techniques"; IEEE Circuits and Devices Magazine; vol. 18, issue 6; Nov. 2002; pp 39.*
Post, G; Muller, A; Grotker, T;"A System-Level Co-Verification Environment for ATM Hardware Design"; Proceedings Design, Automation and Test in Europe; Feb 1998; pp 424-428.*
Brosa, A; Figueras, J;"Digital Signature Proposal for Mixed-Signal Circuits"; Proceedings International Test Conference; Oct 3-5, 2000; pp 1041-1050.*
Kitsos, P; Sklavos, N; Koufopavlou, O;"An Efficient Implementation of the Digital Signature Algorithm"; 9International Conference on Electronics, Circuits and Systems; vol. 3; Sep. 15-18, 2002; pp 1151-1154.*

* cited by examiner

*Primary Examiner*—John Barlow
*Assistant Examiner*—Douglas N. Washburn
(74) *Attorney, Agent, or Firm*—Lowe Hauptman & Berner, LLP

(57) ABSTRACT

An accelerated test method for testing an integrated circuit is described. The accelerated test method has the following steps. First, test vector data is taken as input to the integrated circuit to produce response data as output. Next, a one-way-hash function is used to transform the response data into a test message digest. Next, the test message digest is verified against a standard message digest to determine whether the test message digest meet a predetermined requirement. The one-way-hash function is embedded as part of the BIST circuit in the integrated circuit or implemented within automated test equipment.

28 Claims, 6 Drawing Sheets

# ACCELERATED TEST METHOD AND SYSTEM

BACKGROUND

1. Field of Invention

The present invention relates to an accelerated test method and system. More particularly, the present invention relates to an accelerated test method and system using a one-way-hash function to reduce the integrated circuit test time.

2. Description of Related Art

In the integrated circuit industry, test time is a substantial expense factor in the total cost of device production, especially for the latest multi-million gate designs. In some cases, the cost of the test is higher than the manufacturing cost. Shortening the test time will reduce the production cost.

FIG. 1 shows a traditional verification method used in an integrated circuit test. The traditional verification method relies on data analysis of the test, recorded and analyzed sequentially. For example, a large amount of test vector data 102 is sent to the integrated circuit 104 and the response data 106 is produced in response to the test vector data 102. The response data 106 is recorded and analyzed in the automated test equipment (ATE) 108. A database 110 that stores standard response data is used in the verification process in the automated test equipment 108. Since there is a lot of response data 106 to be verified, the test process consumes a large amount of automated test equipment resource as well as test time.

SUMMARY

The present invention is directed to an accelerated test method and system that satisfy the need to reduce the integrated circuit test time as well as save the production cost.

It is therefore an objective of the present invention to provide an accelerated test method for testing an integrated circuit. It is a method to reduce the integrated circuit test time as well as the production cost.

It is another objective of the present invention to provide an accelerated test method for testing an integrated circuit. The accelerated test method greatly reduces the memory used in the automated test equipment during test.

It is still another objective of the present invention to provide an accelerated test method for testing an integrated circuit. With a one-way-hash module imbedded in the BIST of the integrated circuit under test, the test process is accelerated when the IO speed is the bottleneck of the test process.

In accordance with the foregoing and other objectives of the present invention, an accelerated test method for testing an integrated circuit is disclosed. The accelerated test method includes the following steps. First, test vector data is taken as input for the integrated circuit to produce response data as output. Next, a one-way-hash function is used to transform the response data into a test message digest. Next, the test message digest is verified against a standard message digest to determine whether the test message digest meet a predetermined requirement.

The one-way-hash function is, for example, a SHA-1 or a MD5. The one-way-hash function is performed by a one-way-hash hardware circuit. A SHAX, for example, is a hardware circuit that performs SHA-1. The one-way-hash hardware circuit is embedded as part of the BIST circuit in the integrated circuit.

The one-way-hash function is also suitable for implementation in automated test equipment. For example, the one-way-hash function is performed by a specifically designed single chip in the automated test equipment. A microprocessor or a DSP can be used to perform the one-way-hash function in the automated test equipment.

Because the response data is largely reduced by the one-way-hash module, the integrated circuit test time and the production cost are also reduced. Only the test message digest is verified in the automated test equipment, so the memory used in the automated test equipment is reduced. With a one-way-hash module imbedded in the BIST of the integrated circuit under test, the test message digest is generated before being sent to the automated test equipment via the IO interface. Therefore, the test process is accelerated when the IO speed is the bottleneck of the test process.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
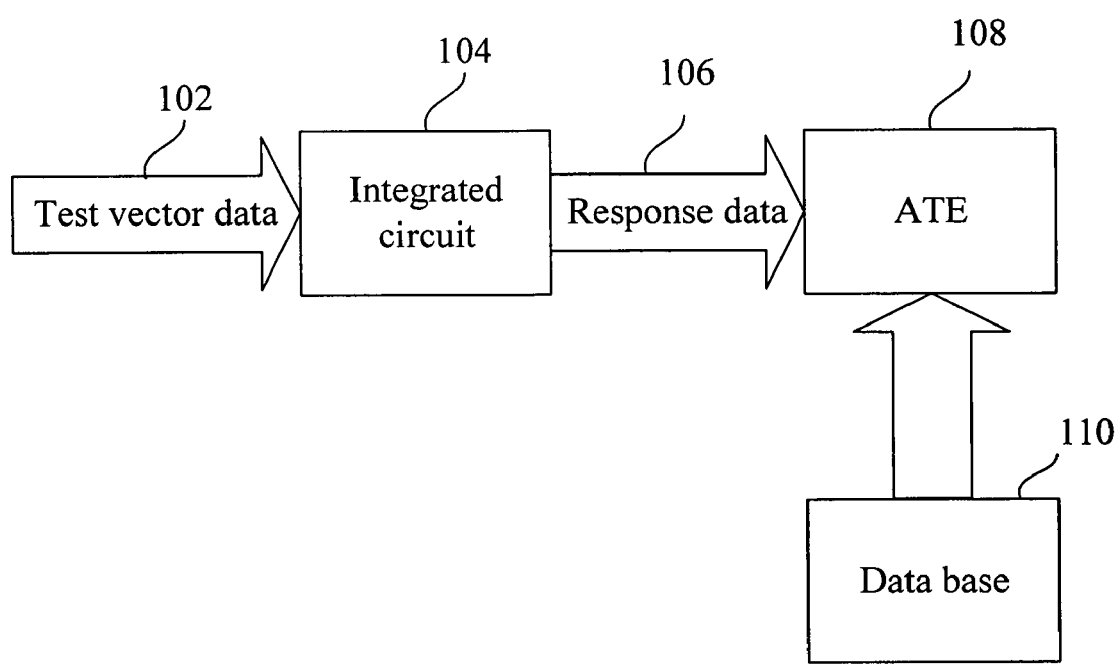
FIG. 1 is a diagram of the prior art.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
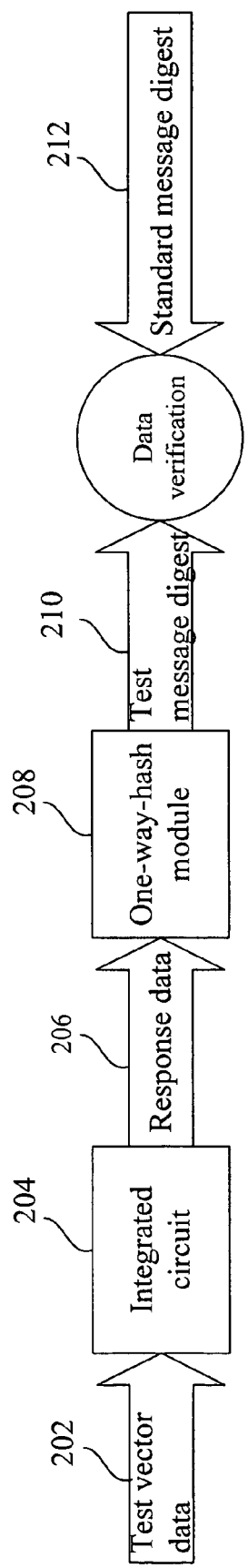
FIG. 2A is a diagram of the accelerated test method of the invention.
Figure 2B:
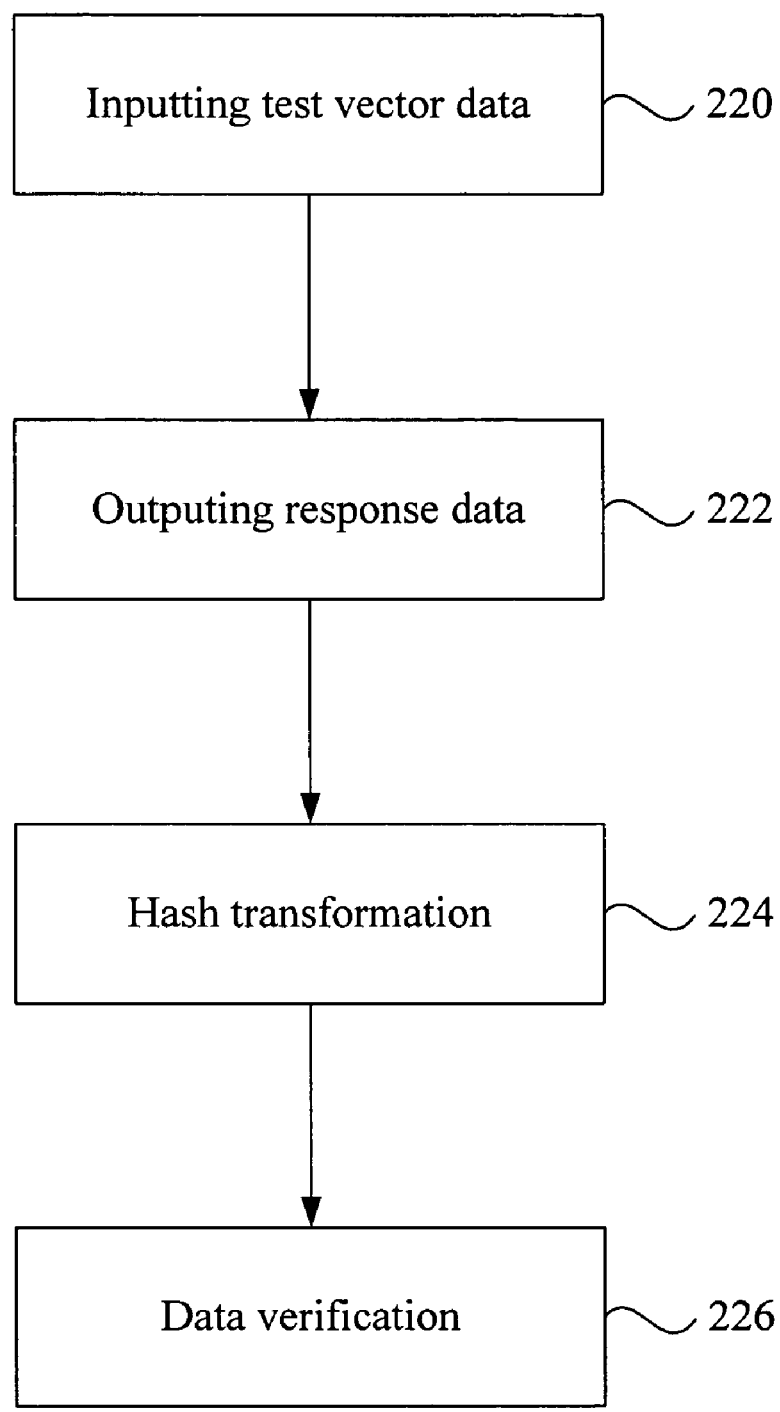
FIG. 2B is a flow chart illustrating the accelerated test method of the invention.

The accelerated test method is used for testing an integrated circuit. FIG. 2A is a diagram of the accelerated test method of the invention. FIG. 2B is a flow chart illustrating the accelerated test method of the invention.

First, test vector data 202 is taken as input to an integrated circuit 204 to produce response data 206 as output (step 220 and step 222). The response data 206 is then sent to a one-way-hash module 208 that performs a one-way-hash function. The one-way-hash function is, for example, a SHA-1 or a MD5. An example of the one-way-hash module 208 is a SHAX that performs SHA-1.

Next, the one-way-hash module 208 is used to transform the response data 206 into a test message digest 210 (step 224). Next, the test message digest 210 is verified against a standard message digest (step 226). For example, the verification process is performed by comparing the test message digest 210 with the standard message digest 212 to determine whether the test message digest 210 meets a predetermined requirement.

ATM is the acronym for "accelerated test method". As mentioned above, ATM uses a one-way-hash function to condense the response data 206 of the integrated circuit under test (after responding to the test vector data 202) into the test message digest 210. The test message digest 210 is equivalent to a unique signature of the integrated circuit 204. The test message digest 210 is verified against the golden signature that is known to be absolutely correct and true. The golden signature is the standard message digest 212 shown in FIG. 2A.

The standard message digest 212 is obtained by the following exemplary method. First, a standard integrated circuit, which has been verified, is selected. Next, the test vector data 202 is taken as input to the standard integrated circuit and a standard response data is produced as output. Next, the one-way-hash module 208 is used to transform the standard response data into the standard message digest 212.

Another example of obtaining the standard message digest 212 is to simulate the behavior of the integrated circuit as well as the one-way-hash function in a computer and to generate the standard message digest in response to the test vector data.

With ATM there is no large amount of data to verify. Only the test message digest 210 of the test response data 206 is verified. The test message digest 210 is extremely short compared to the response data 206. For example, SHAX produces a 160-bit test message digest. Verification of such a short test message digest is very quick and virtually without cost regarding processor resources. For example, hardware XOR of the test message digest 210 and the standard message digest 212 is an efficient implementation for verification.

Figure 3:
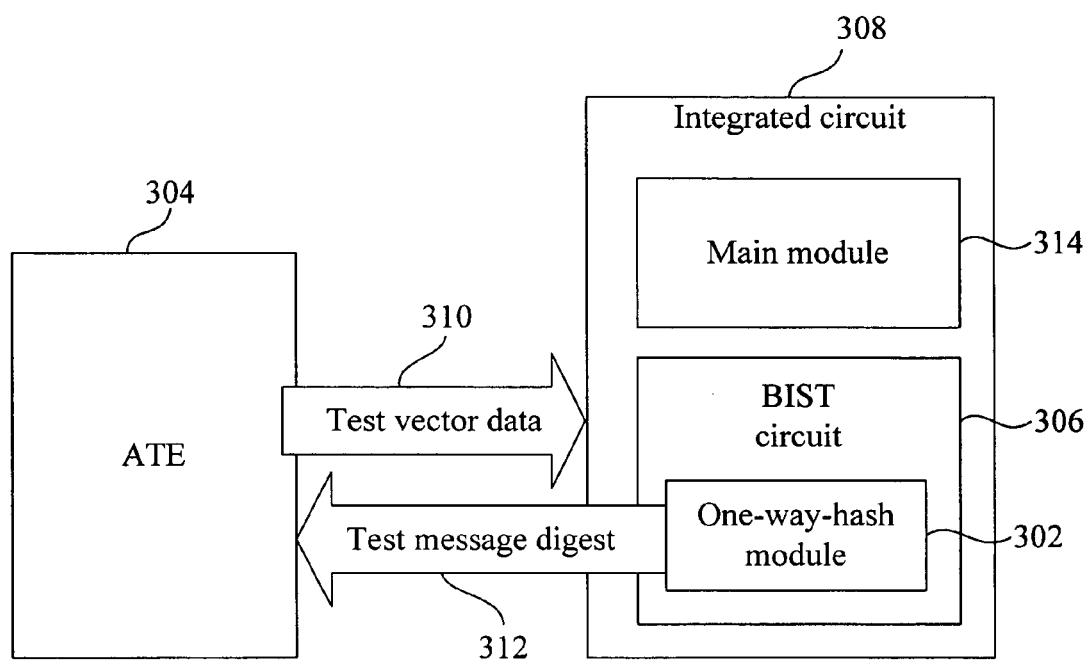
FIG. 3 is a block diagram illustrating the first preferred embodiment of the invention.

ATM can be applied to both Scan Testing and BIST methodologies. FIG. 3 shows a first preferred embodiment of the invention. The integrated circuit 308 has a main module 314 and a BIST circuit 306. The main module 314 is used to perform the main function of the integrated circuit 308. The one-way-hash function is performed by a one-way-hash module 302. The one-way-hash module 302 is a hardware circuit and embedded as part of the BIST circuit 306 in the integrated circuit 308. BIST stands for Built-In-Self-Test.

The automated test equipment 304 sends test vector data 310 to the integrated circuit 308. The one-way-hash-module 302 performs the one-way-hash function on the test response data to generate a test message digest 312. The automated test equipment 304 receives the test message digest 312 and verifies it against the standard message digest.

Figure 4:
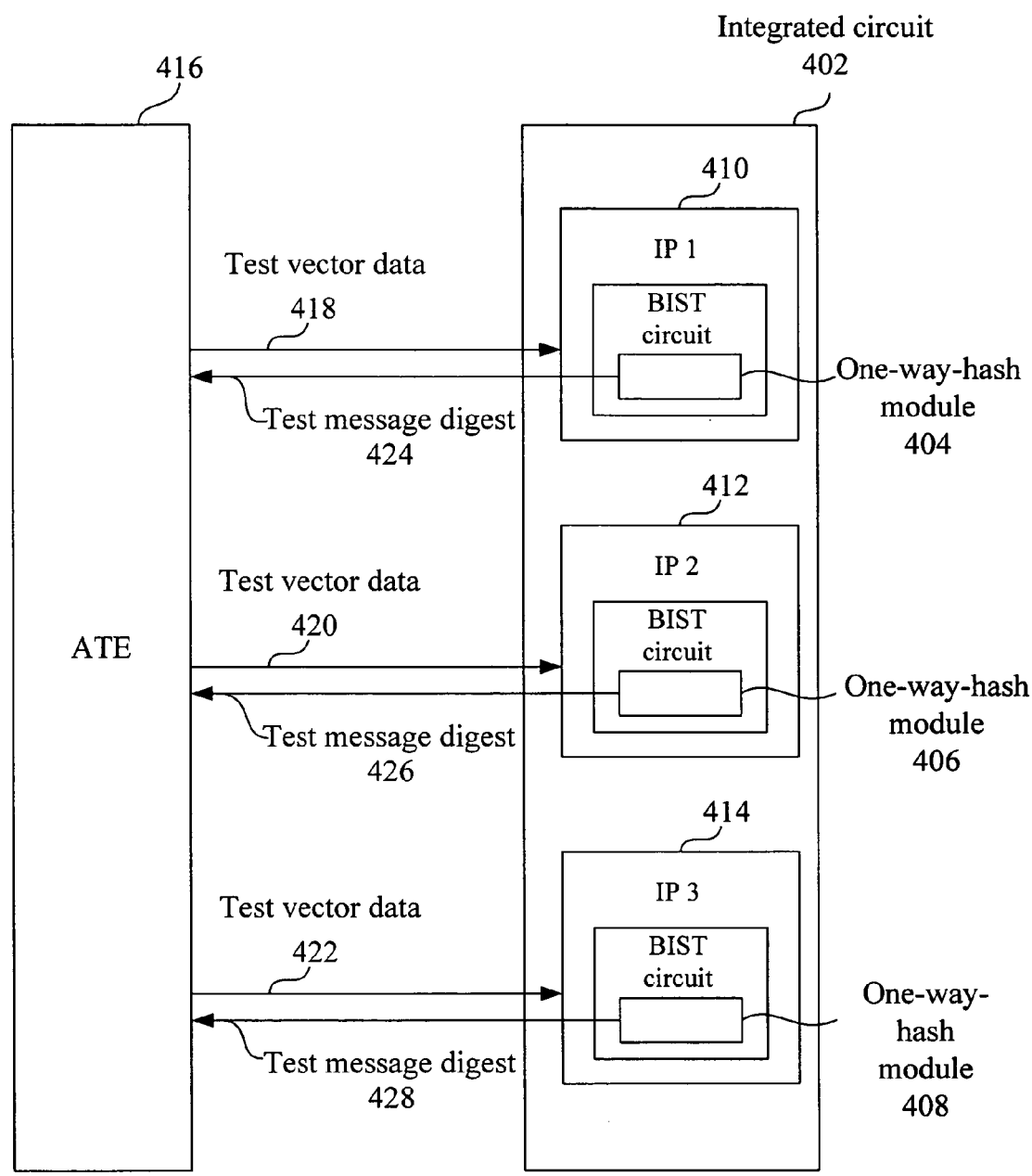
FIG. 4 is a block diagram illustrating the second preferred embodiment of the invention.

FIG. 4 shows a second preferred embodiment of the invention. The integrated circuit 402 includes a plurality of IP (intellectual property) blocks and a plurality of one-way-hash modules are respectively embedded in corresponding IP blocks as part of the BIST circuit in said IP blocks.

For example, the integrated circuit 402 has three IP blocks (IP1 410, IP2 412, and IP3 414). One-way-hash modules 404, 406, and 408 are embedded in IP1 410, IP2 412, and IP3 414, respectively. One-way-hash modules 404, 406, and 408 are all hardware circuits and serve as part of the BIST circuit of IP1 410, IP2 412, and IP3 414, respectively.

As shown in FIG. 4, the automated test equipment 416—that supports CCT technology—sends test vector data 418, 420, and 422 to IP1 410, IP2 412, and IP3 414 respectively. The test message digest 424, 426, and 428 are generated by one-way-hash modules 404, 406, and 408, respectively, and then sent to the automated test equipment 416. The test message digest 424, 426, and 428 are verified in the automated test equipment 416.

Figure 5:
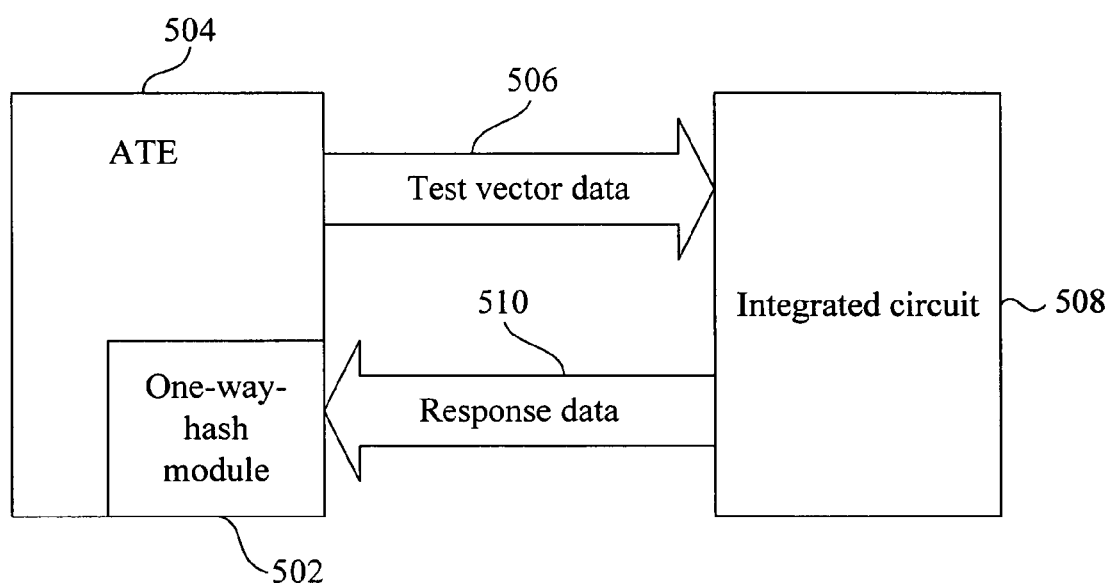
FIG. 5 is a block diagram illustrating the third preferred embodiment of the invention.

FIG. 5 shows a third preferred embodiment according to the invention. The one-way-hash function is performed by a one-way-hash module 502. The one-way-hash module 502 is a hardware circuit and implemented within automated test equipment 504. The automated test equipment 504 sends a test vector data 506 to an integrated circuit 508 and receives response data 510 from the integrated circuit 508. The one-way-hash module 502 receives response data 510 to generate a test message digest to be verified in the automated test equipment 504. The response data 510 is processed on-the-fly by the automated test equipment 504 and no memory is required to store the response data 510. When all test vector data 506 is driven, the test message digest is ready for verification as well. The automated test equipment 504 verifies the test message digest against the standard message digest and no memory is required to store the standard response data.

For example, a chip is specifically designed for performing the one-way-hash function and implemented within the automated test equipment 504. In another example, the one-way-hash function is performed by a microprocessor or a DSP in the automated test equipment 504.

When integrated into the automated test equipment 504, the one-way-hash module 502 helps to reduce the memory and data processing time. The automated test equipment 504 no longer needs to store large amount of test response data 510 or standard response data and perform analysis.

SHAX is a highly suitable hardware for the one-way-hash module in any of the three preferred embodiments mentioned above. SHAX stands for Secure Hash Algorithm Accelerator. SHAX is an embedded hardware accelerator that performs SHA-1 on a message. Performing SHA-1 on a 512-bit message block by software would normally require more than 10,000 instructions and at least as many clock cycles to complete the task. SHAX needs less than 100 clock cycles to complete the same task. SHAX produces a 160 bits message digest for any message less than $2^{64}$ bits in length, which is plenty for any device test.

SHAX completes SHA-1 in just 81 clocks. The maximum number of clocks required to completely process a 512-bit message block is 99 clocks. That includes 1 clock for the optional configuration, 16 clocks to load the message, 1 clock to start SHA-1, and 81 clocks to complete SHA-1.

For example, the SHAX is designed with Verilog RTL and is 100% technology independent. Thus, it is always ready to be embedded in an integrated circuit. The FPGA implementation on Virtex 300E is estimated as 26,000 equivalent gate count reported by Xilinx ISE 5.1. The logic gate count of ASIC implementation is estimated in the range between 15,000 and 20,000.

Although the present invention has been described in considerable detail with reference to certain preferred embodiments thereof, other embodiments are possible. Therefore, their spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An accelerated test method for testing an integrated circuit, comprising:
   taking test vector data as input to said integrated circuit to produce response data as output;
   using a one-way-hash function to transform said response data into a test message digest; and
   verifying said test message digest against a standard message digest to determine whether said test message digest meets a predetermined requirement, wherein said standard message digest is obtained by:
   simulating behavior of said integrated circuit as well as said one-way-hash function in a computer and generating said standard message digest in response to said test vector data.

2. The accelerated test method of claim 1, wherein said test message digest is verified by comparing said test message digest with said standard message digest.

3. The accelerated test method of claim 1, wherein said one-way-hash function is SHA-1 performed by a SHAX.

4. The accelerated test method of claim 1, wherein said one-way-hash function is MD5.

5. The accelerated test method of claim 1, wherein said one-way-hash function is performed by a one-way-hash hardware circuit.

6. The accelerated test method of claim 5, wherein said one-way-hash hardware circuit is embedded as part of a BIST circuit in said integrated circuit.

7. The accelerated test method of claim 5, wherein said integrated circuit comprises a plurality of IP blocks and a plurality of one-way-hash hardware circuits are respectively embedded in corresponding IP blocks as part of a BIST circuit in said IP blocks.

8. The accelerated test method of claim 5, wherein said one-way-hash hardware circuit is implemented within automated test equipment.

9. The accelerated test method of claim 5, wherein said one-way-hash function is performed by specifically designed single chip in automated test equipment.

10. The accelerated test method of claim 1, wherein said one-way-hash function is performed by a microprocessor in automated test equipment.

11. The accelerated test method of claim 1, wherein said one-way-hash function is performed by a DSP in automated test equipment.

12. The accelerated test method of claim 1, wherein said standard message digest is obtained by:
   taking said test vector data as input to a standard integrated circuit and producing a standard response data as output; and
   using said one-way-hash function to transform said standard response data into said standard message digest;
   wherein said standard integrated circuit is verified to be faultless before said standard message digest is generated.

13. An accelerated test system for testing an integrated circuit, comprising:
   an automated test equipment for sending test vector data to said integrated circuit so that said integrated circuit produces response data in response to said test vector data and for receiving a test message digest to be verified against a standard message digest to determine whether said test message digest meets a predetermined requirement; and
   a one-way-hash module for receiving said response data and performing a one-way-hash function to generate said test message digest.

14. The accelerated test system of claim 13, further comprising a comparator for comparing said test message digest with said standard message digest.

15. The accelerated test system of claim 13, wherein said one-way-hash module is a SHAX performing SHA-1.

16. The accelerated test system of claim 13, wherein said one-way-hash module performs MD5.

17. The accelerated test system of claim 13, wherein said one-way-hash module is a one-way-hash hardware circuit.

18. The accelerated test system of claim 17, wherein said one-way-hash hardware circuit is embedded as part of a BIST circuit in said integrated circuit.

19. The accelerated test system of claim 17, wherein said integrated circuit comprises a plurality of IP blocks and a plurality of one-way-hash hardware circuits are respectively embedded in corresponding IP blocks as part of the BIST circuit in said IP blocks.

20. The accelerated test system of claim 17, wherein said one-way-hash hardware circuit is implemented within said automated test equipment.

21. The accelerated test system of claim 17, wherein said one-way-hash hardware circuit is a specifically designed single chip in said automated test equipment.

22. The accelerated test system of claim 13, wherein said one-way-hash module is represented by a code and programmed in a microprocessor in said automated test equipment.

23. The accelerated test system of claim 13, wherein said one-way-hash function is performed by a DSP in automated test equipment.

24. An integrated circuit for accelerated testing, comprising:
   a main module for producing response data in response to test vector data from automated test equipment; and
   a plurality of IP blocks and a plurality of one-way-hash module, wherein said one-way-hash modules are used for receiving said response data and performing a one-way-hash function to generate a test message digest to be sent to said automated test equipment, and said one-way-hash modules are respectively embedded in corresponding IP blocks as part of a BIST circuit in said IP blocks, and wherein each of said IP blocks comprises a main module;
   wherein said test message digest is verified against a standard message digest to determine whether said test message digest meets a predetermined requirement in said automated test equipment.

25. The integrated circuit of claim 24, wherein said one-way-hash module is a SHAX performing SHA-1.

26. The integrated circuit of claim 24, wherein said one-way-hash module performs MD5.

27. An accelerated test system for testing an integrated circuit, wherein said integrated circuit comprises a plurality of IP blocks, said accelerated test system comprising:
   an automated test equipment for sending test vector data to said integrated circuit so that said integrated circuit produces response data in response to said test vector data and for receiving a test message digest to be verified a against a standard message digest to determine whether said test message digest meets a predetermined requirement; and
   a plurality of one-way-hash hardware circuits for receiving said response data and performing a one-way-hash function to generate said test message digest, wherein said one-way-hash hardware circuits are respectively embedded in corresponding IP blocks as part of a BIST circuit in said IP blocks.

28. The accelerated test system of claim 27, further comprising a comparator for comparing said test message digest with said standard message digest.

* * * * *